(12) United States Patent
Ichihara et al.

(10) Patent No.: US 9,964,609 B2
(45) Date of Patent: May 8, 2018

(54) OPTICALLY PUMPED MAGNETOMETER

(71) Applicant: CANON KABUSHIKI KAISHA, Tokyo (JP)

(72) Inventors: Sunao Ichihara, Kawasaki (JP); Natsuhiko Mizutani, Tokyo (JP); Tetsuo Kobayashi, Kyoto (JP); Shuji Taue, Kyoto (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 1310 days.

(21) Appl. No.: 13/860,299

(22) Filed: Apr. 10, 2013

(65) Prior Publication Data
US 2013/0278253 A1    Oct. 24, 2013

(30) Foreign Application Priority Data
Apr. 18, 2012   (JP) ................... 2012-094655

(51) Int. Cl.
*G01R 33/26* (2006.01)
(52) U.S. Cl.
CPC ................... *G01R 33/26* (2013.01)
(58) Field of Classification Search
USPC ............ 324/300–322; 600/407–435
See application file for complete search history.

(56) References Cited

U.S. PATENT DOCUMENTS

| 6,141,170 A | 10/2000 | Hatae et al. |
| 6,318,092 B1 | 11/2001 | Happer et al. |
| 6,586,725 B2 | 7/2003 | Mizutani et al. |
| 6,603,557 B2 | 8/2003 | Mizutani |
| 6,785,003 B2 | 8/2004 | Mizutani et al. |
| 7,038,450 B2 | 5/2006 | Romalis et al. |

(Continued)

FOREIGN PATENT DOCUMENTS

JP    2012-042237 A    3/2012

OTHER PUBLICATIONS

Shah, et al., "Spin-Exchange Relaxation-Free Magnetometry Using Elliptically Polarized Light", Physical Review A 80, 013416, published Jul. 24, 2009, pp. 013416-1 to 013416-6.

(Continued)

*Primary Examiner* — Melissa Koval
*Assistant Examiner* — Tiffany Fetzner
(74) *Attorney, Agent, or Firm* — Fitzpatrick, Cella, Harper & Scinto (57) ABSTRACT

There is provided an optically pumped magnetometer, in which a pump light having a first wavelength to spin-polarize a first alkali-metal atom group is made to enter a cell containing the first alkali-metal atom group and a second alkali-metal atom group interacting via spin exchange with the first alkali-metal atom group, a probe light having a second wavelength different from the first wavelength to measure spin polarization of the second alkali-metal atom group is made to enter the cell to form the same optical axis as the pump light, a wavelength discrimination unit is provided to discriminate between the pump light and the probe light that passed through the cell depending on a different in wavelength, and the rotation angle of a polarization plane of the probe light that passed through the cell is measured so that the degree of flexibility of the device layout can be increased.

10 Claims, 5 Drawing Sheets

(56) References Cited

U.S. PATENT DOCUMENTS

| | | | |
|---|---|---|---|
| 7,251,741 B2 | 7/2007 | Kobayashi et al. | |
| 7,456,523 B2 | 11/2008 | Kobayashi | |
| 8,067,854 B2 | 11/2011 | Kobayashi | |
| 8,212,556 B1* | 7/2012 | Schwindt | G01R 33/26 324/304 |
| 8,334,690 B2* | 12/2012 | Kitching | G01R 33/0286 324/301 |
| 9,383,419 B2 | 7/2016 | Mizutani et al. | |
| 2011/0031969 A1* | 2/2011 | Kitching | G01R 33/0286 324/304 |
| 2013/0127458 A1 | 5/2013 | Mizutani et al. | |
| 2013/0207649 A1 | 8/2013 | Mizutani et al. | |
| 2013/0278253 A1* | 10/2013 | Ichihara | G01R 33/26 324/304 |

OTHER PUBLICATIONS

Cort Johnson, et al., "Magnetoencephalography with a two-color pump-probe, fiber-coupled atomic magnetometer", Applied Physics Letters 97, 243703 (2010).

Yosuke Ito, et al, "Sensitivity Improvement of Spin-Exchange Relaxation Free Atomic Magnetometers by Hybrid Optical Pumping of Potassium and Rubidium", IEEE Transactions on Magnetics, vol. 47, No. 10 (2011).

Yosuke Ito, et al., "Changes in Magnetic Field Responses due to Pump Beam Attenuation of an Optically Pumped Atomic Magnetometer using a Hybrid Cell of K and Rb Atoms" (2012).

JP Refusal dated May 9, 2017 in Japanese Application No. 2013-083558.

Japanese Office Action dated Feb. 7, 2017 in Japanese Application No. 2013-083558.

Johnson, et al., "Magnetoencephalography with a two-color pump-probe, fiber-coupled atomic magnetometer", Applied Physics Letters 97 (2010).

Ito, et al., "Sensitivity Improvement of Spin-Exchange Relaxation Free Atomic Magnetometers by Hybrid Optical Pumping of Potassium and Rubidium", IEEE Transactions on Magnetics, vol. 47, No. 10 (Oct. 2011).

Ito, et al., "Changes in Magnetic Field Responses due to Pump Beam Attenuation of an Optically Pumped Atomic Magnetometer using a Hybrid Cell of K and Rb Atoms" (Mar. 2012).

* cited by examiner

OPTICALLY PUMPED MAGNETOMETER

BACKGROUND OF THE INVENTION

Field of the Invention

The present invention relates to a sensing method for measuring an intensity of a magnetic field, specifically to an optically pumped magnetometer using atomic electron spin or nuclear spin.

Description of the Related Art

An optically pumped magnetometer measures a rotation, by a measured magnetic field, of a spin of an atom group polarized by a pump light, as a rotation of a polarization plane of a probe light.

As such an optically pumped magnetometer, the specification of U.S. Pat. No. 7,038,450 describes an optically pumped magnetometer having a cell containing alkali-metal gases, a pump light source, and a probe light source to have an ability to detect weak magnetic fields. In this specification of U.S. Pat. No. 7,038,450, a probe light is made to enter in a direction perpendicular to the optical path of a pump light. Further, in "Spin-exchange relaxation-free magnetometry using elliptically polarized light," Phys. Rev. A 80, 013416 (2009), V. Shah and M. V. Romalis describe an optically pumped magnetometer in which a single-axis elliptically polarized light is made to enter a cell to increase the degree of flexibility of the device layout.

Further, in the specification of U.S. Pat. No. 6,318,092, a technique for the purpose of polarizing $^3$He, though not for the purpose of use in a magnetometer, is reported, in which spin exchange interaction between Rb and K is used to transfer the rubidium (Rb) spin polarization to the potassium (K). In the technique, the Rb is optically pumped to polarize the K, and the $^3$He is finally polarized. Using this spin exchange interaction, also, the K can be polarized sufficiently like in that of optical pumping.

However, the above-mentioned conventional examples of optically pumped magnetometers have the following problems: In the specification of U.S. Pat. No. 7,038,450, since the pump light and the probe light are arranged orthogonally, a flexibility of the device layout is restricted. Particularly, since optical axes of the pump light and the probe light interfere with array-arranged cells, such an array-arrangement of multiple cells is difficult. Further, in the above technique described by Shah et al., the probe light is elliptically polarized to create a layout to have the same action as in a layout in which a circularly polarized pump light and a linearly polarized probe light are concentrically overlapped. However, in measuring the rotation angle of the polarization plane of the probe light, it is difficult to separate between a component acting as the pump light and a component acting as the probe light, and hence optical shot noise due to a component acting as the pump light cannot be separated from a signal, thereby causing a problem that a noise level increases.

SUMMARY OF THE INVENTION

The present invention is directed to an optically pumped magnetometer capable of separating a pump light and a probe light under a configuration intended to make the pump light and the probe light form the same optical axis in order to increase the degree of flexibility of a device layout.

An optically pumped magnetometer using atomic electron spin or nuclear spin according to the present invention includes: a cell containing at least a first alkali-metal atom group and a second alkali-metal atom group interacting via spin exchange with the first alkali-metal atom group; a pump light optical system for making a pump light enter the cell, where the pump light has a first wavelength to spin-polarize the first alkali-metal atom group; a probe light optical system to make a probe light enter the cell to form an optical axis identical to the pump light, where the probe light has a second wavelength different from the first wavelength, and where the probe light measures spin polarization of the second alkali-metal atom group; a wavelength discrimination unit for discriminating between the pump light and the probe light that passed through the cell depending on a different in wavelength; and a measuring unit for measuring a rotation angle of a polarization plane of the probe light that passed through the cell.

According to the present invention, since the pump light and the probe light can be separated under a configuration intended to make the pump light and the probe light form the same optical axis, there can be provided an optically pumped magnetometer with an increased degree of flexibility of the device layout.

Further features of the present invention will become apparent from the following description of exemplary embodiments with reference to the attached drawings.

DESCRIPTION OF THE EMBODIMENTS

An optically pumped magnetometer using atomic electron spin or nuclear spin according to an exemplary embodiment of the present invention will now be described with reference to the accompanying drawings.

Figure 1:
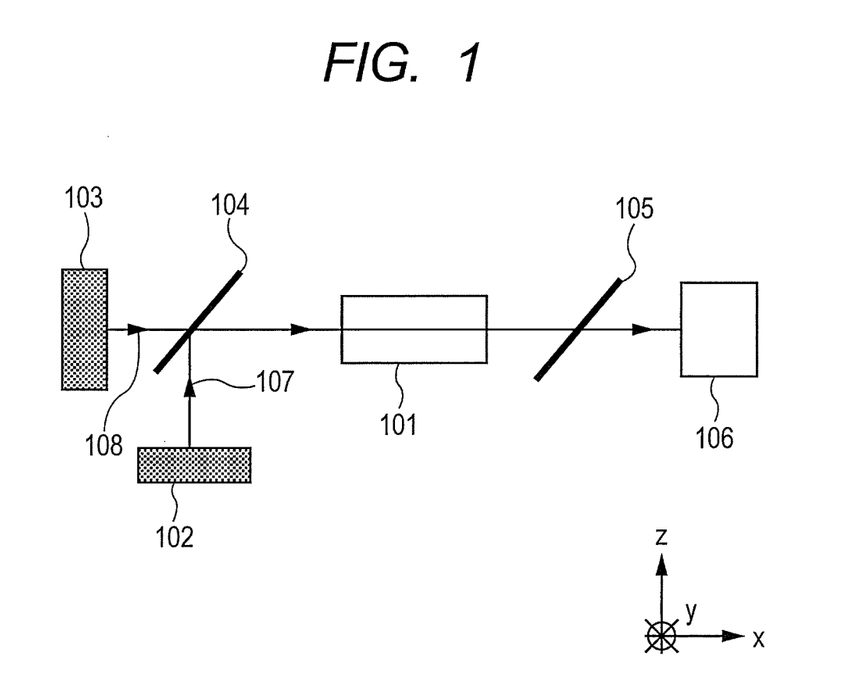
FIG. 1 is a conceptual diagram of an optically pumped magnetometer according to an exemplary embodiment of the present invention.

As illustrated in FIG. 1, the optically pumped magnetometer according to the embodiment includes a cell 101, a pump light source (pump light optical system) 102, a probe light source (probe light optical system) 103, dichroic mirrors 104 and 105, and a polarization measurement system (measurement unit) 106. The cell 101 contains two different kinds of alkali-metal atom groups (atom groups), namely a first alkali-metal atom group and a second alkali-metal atom group which interacts via spin exchange with the first alkali-metal atom group.

Potassium atoms (K), rubidium atoms (Rb), or cesium atoms (Cs) can be used as the first alkali-metal atom group.

Potassium atoms (K), rubidium atoms (Rb), or cesium atoms (Cs) can be used as the second alkali-metal atom group.

The polarization of a pump light 107 emitted from the pump light source 102 is circularly polarized. On the other hand, the polarization of a probe light 108 emitted from the probe light source 103 is linearly polarized.

When the rubidium atoms (Rb) are used as the first alkali-metal atom group and the potassium atoms (K) are used as the second alkali-metal atom group, light having a wavelength of 795.0 nm (first wavelength) can be used as the pump light, and light having a wavelength not less than 769 nm and not more than 771 nm (second wavelength) can be used as the probe light.

When the cesium atoms (Cs) are used as the first alkali-metal atom group and the potassium atoms (K) are used as the second alkali-metal atom group, light having a wavelength of 894.6 nm (first wavelength) can be used as the pump light, and light having a wavelength not less than 769 nm and not more than 771 nm (second wavelength) can be used as the probe light.

When the potassium atoms (K) are used as the first alkali-metal atom group and the rubidium atoms (Rb) are used as the second alkali-metal atom group, light having a wavelength of 770.1 nm (first wavelength) can be used as the pump light, and light having a wavelength not less than 794 nm and not more than 796 nm (second wavelength) can be used as the probe light.

When the potassium atoms (K) are used as the first alkali-metal atom group and the cesium atoms (Cs) are used as the second alkali-metal atom group, light having a wavelength of 770.1 nm (first wavelength) can be used as the pump light, and light having a wavelength not less than 893 nm and not more than 896 nm (second wavelength) can be used as the probe light.

When the cesium atoms (Cs) are used as the first alkali-metal atom group and the rubidium atoms (Pb) are used as the second alkali-metal atom group, light having a wavelength of 894.6 nm (first wavelength) can be used as the pump light, and light having a wavelength not less than 794 nm and not more than 796 nm (second wavelength) can be used as the probe light.

When the rubidium atoms (Rb) are used as the first alkali-metal atom group and the cesium atoms (Cs) are used as the second alkali-metal atom group, light having a wavelength of 795.0 nm (first wavelength) can be used as the pump light, and light having a wavelength not less than 893 nm and not more than 896 nm (second wavelength) can be used as the probe light.

The dichroic mirror 104 is arranged to make the probe light enter the cell 101 so as to form the same optical axis as the pump light, where the probe light measures the spin polarization of the second alkali-metal atom group. The probe light 108 that passed through the cell 101 is transmitted through the dichroic mirror (wavelength discrimination unit) 105 to enter the polarization measurement system 106. The pump light 107 that passed through the cell 101 is blocked by the dichroic mirror 105 not to enter the detector 106.

In the above structure, spin directions of e.g. RB atoms as the first alkali-metal atom group in the cell 101 are aligned to spin-polarize by the circularly polarized pump light 107. At this time, the wavelength of the pump light 107 is made to agree with a D1 transition wavelength of the RB atoms. The K atoms as the second alkali-metal atom group and the RB atoms exchange their spins with each other constantly. Therefore, when the RB atoms are polarized by optical pumping and the directions of RB atom spins are aligned, this spin exchange interaction aligns the K atom spins in the same direction. The spin of spin-polarized atoms is subjected to a torque, depending on the magnetic field, to precess. It is known that the optical Bloch equations can be used as equations of motion for the spin being subjected to optical pumping in a magnetic field to describe a behavior of the spin.

Spin vectors $S^K$ and $S^{Rb}$ of the K atom and the Rb atom are expressed by the following (Eq. 1):

$$\vec{S}^{Rb}=(S_x^{Rb}, S_y^{Rb}, S_z^{Rb})$$

$$\vec{S}^{K}=(S_x^{K}, S_y^{K}, S_z^{K}) \quad \text{(Eq. 1)}$$

The behavior of this spin is determined by interaction with the pump light 107, interaction with magnetic field B, and spin exchange interaction between the RB atom and the K atom. The behavior of the spin obeys the Bloch equations expressed in the following (Eq. 2):

$$\frac{d}{dt}\vec{S}^{Rb} = \frac{\gamma_e}{Q_{Rb}}\vec{B}\times\vec{S}^{Rb} - \frac{R_{op}^{Rb}+R_{rel}^{Rb}}{Q_{Rb}}\vec{S}^{Rb} + \gamma_{SE}^{Rb}\left(\vec{S}^{K}-\vec{S}^{Rb}\right) + \frac{\vec{\sigma}}{2}\frac{R_{op}^{Rb}}{Q_{Rb}} \quad \text{(Eq. 2)}$$

$$\frac{d}{dt}\vec{S}^{K} = \frac{\gamma_e}{Q_{K}}\vec{B}\times\vec{S}^{K} - \frac{R_{rel}^{K}}{Q_{K}}\vec{S}^{K} + \gamma_{SE}^{K}\left(\vec{S}^{Rb}-\vec{S}^{K}\right).$$

Here, the first terms on the right-hand sides of the upper and lower equations in (Eq. 2) expresses the behavior of the spin in an external magnetic field. $\gamma_e$ is an electron gyromagnetic ratio. $Q_{Pb}$ and $Q_K$ are quantities called slowdown factors depending on the spin polarization rate. Vector B denotes a magnetic field vector. This term indicates the precession of vector B when the direction of spin polarization is taken as the rotation axis.

The second terms on the right-hand sides of both equations express spin relaxation. $R^{Rb}_{rel}$ and $R^{K}_{rel}$ denote spin relaxation rates of the Rb atom and the K atom, respectively, representing the magnitude of relaxation of spin polarization. $R^{Rb}_{OP}$ existing in the upper equation of (Eq. 2) is a quantity called a pumping rate, representing the magnitude of optical pumping of Rb atoms by the pump light 107. The pump light concurrently contributes also to the relaxation of spin polarization. The contribution is included in the term $R^{Rb}_{OP}$ existing in the second term on the right-hand side of the upper equation.

The third terms on the right-hand sides of both equations express spin exchange between the K atom and the Rb atom. $\gamma^{Rb}_{SE}$ represents the magnitude of spin exchange interaction of the K atom group with the Rb atom group, and $\gamma^{Rb}_{SE}$ represents the magnitude of spin exchange interaction of the Rb atom group with the K atom group. There is a relationship between both as in the following (Eq. 3):

$$\frac{\gamma^{Rb}_{SE}}{\gamma^{K}_{SE}} = \frac{[K]}{[Rb]}. \quad \text{(Eq. 3)}$$

Here, [K] and [Rb] denote the number densities of K atoms and Rb atoms existing as vapors in the cell, respectively. This interaction transfers the polarization of the Rb atoms induced by optical pumping to that of the K atoms, and the K atoms are also polarized.

In the fourth term on the right-hand side of the upper equation in (Eq. 2), vector σ is a circularly polarized vector of the pump light 107, which faces in a propagation direction of the pump light 107. The magnitude of the vector is +1 in the case of clockwise circular polarization, −1 in the case of counterclockwise circular polarization, or in the case of elliptical polarization, the absolute value becomes smaller than 1. In the optically pumped magnetometer, there are two operating states depending on the frequency of the measured magnetic field. The following will describe the two operating states with reference to FIG. 2A, FIG. 2B, and FIG. 2C illustrating the behavior of spins in magnetic fields.

First, the measurement of a DC magnetic field will be described. The DC magnetic field called here means that the frequency of the measured magnetic field is approximately equal to or less than 10 Hz. In this case, the magnetic field in the cell is adjusted to be approximately equal to or less than nT (nanotesla). This situation can be described well by a steady solution in (Eq. 2) that the time change of spin is zero.

Figure 2A:
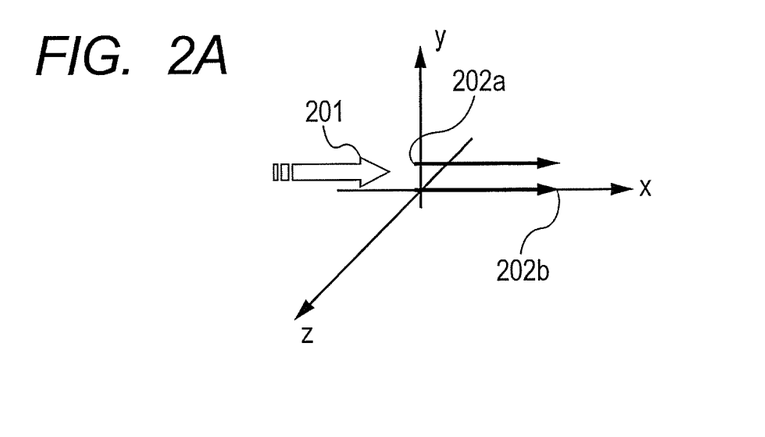
FIGS. 2A, 2B and 2C are conceptual diagrams illustrating the behavior of atomic spins in the embodiment of the present invention.
Figure 2B:
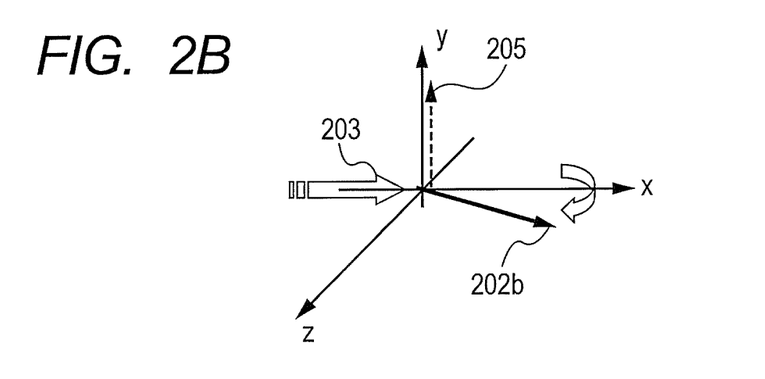
Figure 2C:
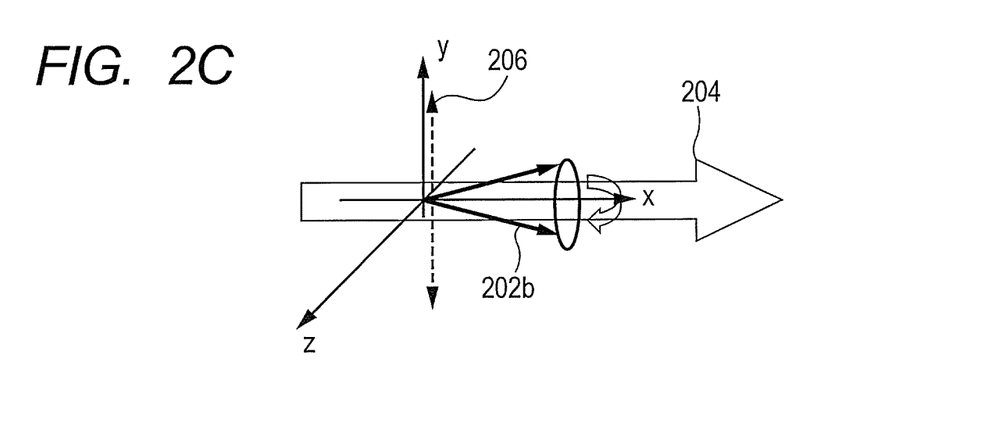

FIG. 2A illustrates such a situation that a pump light 201 enters the cell under an environment where the magnetic field is nearly zero. A probe light is omitted here. An Pb atomic spin 202a polarized by the pump light 201 exchanges its spin with a K atomic spin 202b, and hence the K spin 202b is also polarized in the direction of the pump light 201. FIG. 2B illustrates a case where a measured magnetic field 205 is applied under the situation in a direction perpendicular to the pump light 201 (y direction in FIG. 2B). This measured magnetic field 205 rotates the K spin 202b. Then, an x component $S^K_x$ of the K spin 202b rotated by the magnetic field is measured by a probe light 203. In such a measurement, there is sensitivity to a magnetic field in a direction perpendicular to the pump light 201, i.e., the y direction in FIG. 2B, or a magnetic field in the z direction.

Next, the measurement of an AC magnetic field will be described. The AC magnetic field called here means that the frequency of the measured magnetic field corresponds approximately to 10 Hz or more. In other words, the Larmor frequency is also adjusted to 10 Hz or more. A bias magnetic field can also be applied in the direction of the pump light to cause the optically pumped magnetometer to perform at resonance in order to measure an oscillating magnetic field.

FIG. 2C illustrates a state in which a bias magnetic field 204 is applied to the magnetometer in the x direction and the K spin 202b is precessing around the direction of the bias magnetic field 204 as the rotation axis thereof at a Larmor frequency f defined by the magnitude $B_x$ of the bias magnetic field 204. There is a relationship between the magnitude Bx of the bias magnetic field 204 $B_x$ and the Larmor frequency f as in the following (Eq. 4):

$$2\pi f = \frac{\gamma_e}{Q_K} B_x. \quad \text{(Eq. 4)}$$

Here, an oscillating magnetic field as the measurement target with the frequency f is applied in a direction perpendicular to the bias magnetic field 204. At this time, the behavior of the K spin 202b is described by a steady solution for Larmor precession, which can be solved by using rotating wave approximation in (Eq. 2). In this measurement, since a rotating magnetic field component is measured among the oscillating magnetic field components, there is sensitivity to a magnetic field in the direction perpendicular to the bias magnetic field 204, i.e., a magnetic field 206 in the y direction or the z direction in FIG. 2C.

When the probe light 108 passes through a spin-polarized medium in a direction parallel to the propagation direction of the probe light 108, the polarization plane of the probe light 108 rotates by the magnetooptical effect. The rotation angle (Faraday rotation angle) of this polarization plane is determined by the magnitude of spin polarization in the direction parallel to the propagation direction of the probe light 108. Therefore, the Faraday rotation angle in the magnetometer for measuring the DC magnetic field and the AC magnetic field has a magnitude on which the magnitude of the magnetic field vector B is reflected.

The polarization measurement system 106 measures the Faraday rotation angle in the probe light 108. As such a measurement system, a balance-type polarization measurement system or a cross Nicole polarization measurement system can be used. In the polarization measurement, there exists fundamental noise called optical shot noise proportional to the square root of the number of photons. The optical shot noise resulting from the pump light can be removed by the dichroic mirror 105 shielding the pump light 107.

Figure 3:
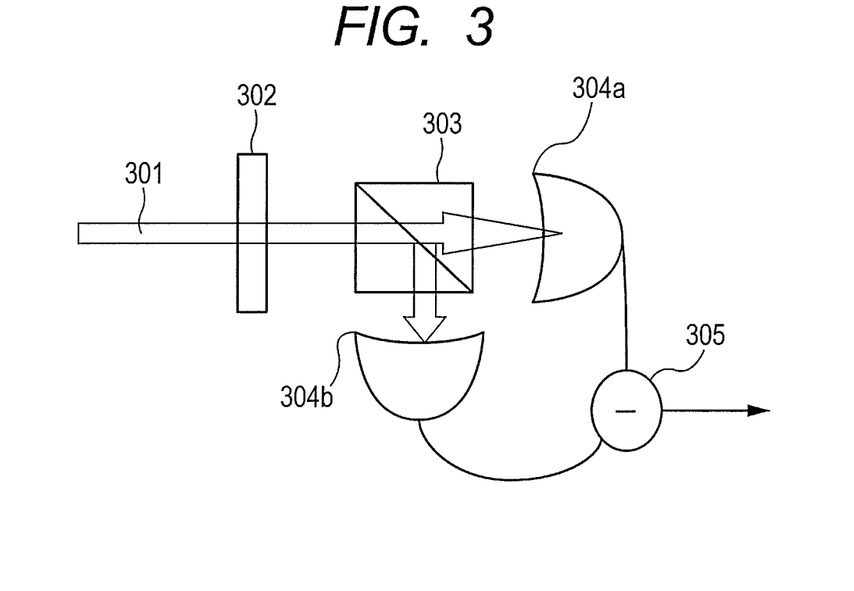
FIG. 3 is a schematic diagram of a balanced polarization measurement system in the embodiment of the present invention.

This will be described in detail with reference to FIG. 3. FIG. 3 is a schematic diagram of a balance-type polarization measurement system as one of polarization measurement methods. The balance-type polarization measurement system has a half-wave plate 302, a polarizing beam splitter 303, two photodiodes 304a and 304b, and a differential circuit 305.

When a linearly polarized probe light 301 enters, the half-wave plate 302 rotates the polarization plane of the probe light 301. Further, the polarizing beam splitter 303 splits the probe light 301 into a p-polarized light component and an s-polarized light component perpendicular to the p-polarized light component along the axis of the polarizing beam splitter 303. The two light split by the polarizing beam splitter 303 enter the photodiodes 304a and 304b, respectively, and they are converted into photocurrents corresponding to the intensities of the respective light. The differential circuit 305 converts a difference value between the two photocurrents into a voltage, and outputs the voltage. A direction of the half-wave plate 302 is so adjusted that, when the measured magnetic field is zero, light of the same intensity will enter the two photodiodes 304a and 304b. In this case, an output signal of the differential circuit 305 is zero.

When the polarization plane of the probe light 301 is rotated by the measured magnetic field, the ratio of intensities of the lights split by the polarizing beam splitter 303 varies. Therefore, the Faraday rotation angle can be measured by the output signal of the differential circuit 305.

When the probe light 301 is completely linearly polarized, an inclination with respect to the magnetic field of this output signal is proportional to the number of photons incident on the polarizing beam splitter 303. On the other hand, optical shot noise contributes to the output signal as fundamental noise. This shot noise is proportional to the square root of the number of photons incident on the polarizing beam splitter 303. Therefore, the SN ratio to the shot noise increases as the number of photons increases.

Since the circularly polarized pump light does not contribute to the output signal, even if the pump light enters this balanced-type polarization measurement system, a response signal to the magnetic field does not increase. However, the circularly polarized pump light also contributes as optical shot noise in the same way. Therefore, if the pump light is mixed in, noise will increase by an amount corresponding to the optical shot noise resulting from the pump light, despite that the signal is not increased, resulting in reduction in SN ratio.

The following will describe examples of the present invention.

Example 1

Figure 4:
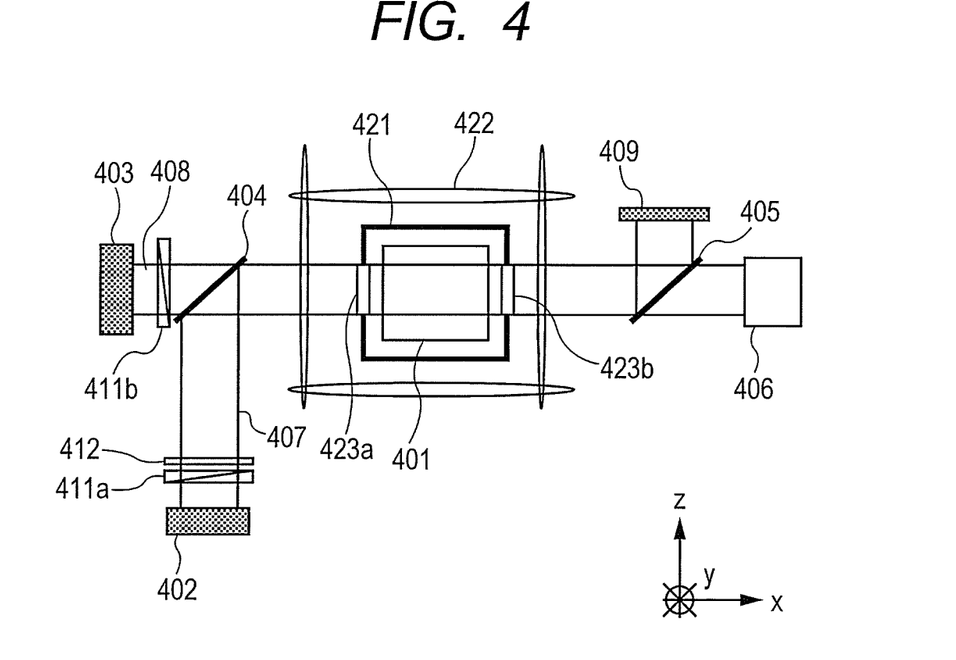
FIG. 4 is a schematic sectional view of an optically pumped magnetometer in Example 1 of the present invention.

An exemplary structure of an optically pumped magnetometer to which the present invention is applied will be described as Example 1 with reference to FIG. 4. As illustrated in FIG. 4, an alkali-metal hybrid optically pumped magnetometer of the example includes a cell 401 containing two different kinds of alkali-metal atom groups, namely rubidium (Rb) and potassium (K), a pump light source 402, and a probe light source 403. The optically pumped magnetometer also includes dichroic mirrors 404 and 405, a polarization measurement system 406, an optical terminator 409, linear polarizers 411a and 411b, a quarter-wave plate 412, an isothermal heat-insulation bath 421, a tri-axial Helmholtz coil 422, and optical windows 423a and 423b.

The cell 401 is made of a material such as glass, which is transparent to the probe light and the pump light. Rubidium (Rb) and potassium (K) are enclosed in the cell 401 as alkali-metal atom groups, and hermetically sealed. Helium (He) and nitrogen ($N_2$) are also enclosed as buffer gas and quenching gas. Since the buffer gas suppresses the diffusion of the polarized alkali-metal atoms, it is effective in reducing spin relaxation due to collisions against the cell walls to increase the spin polarization. The $N_2$ gas is quenching gas for absorbing energy from Rb in an excited state to prevent Rb from emitting light, and this is effective in increasing the efficiency of optical pumping.

Among the alkali-metal atoms, the K atom has the smallest scattering cross-section area in the destruction of spin polarization due to collisions with the same atoms or with the He atoms, and the Rb atom has the second smallest scattering cross-section area. Therefore, a combination of the K atoms and the Rb atoms is preferred as a combination of alkali-metal atoms to build a magnetic sensor having a long relaxation time and with a high response to a signal.

An isothermal heat-insulation bath 421 is installed around the cell 401. Upon measurement, the cell 401 is heated up to 200° C. to increase the density of alkali-metal gases in the cell 401. As a heating method, heated inert gas is injected from the outside into the isothermal heat-insulation bath 421 to heat the cell 401. The isothermal heat-insulation bath 421 retains this heat. In the isothermal heat-insulation bath 421, the optical windows 423a and 423b are placed on the optical path of a pump light 407 and a probe light 408 to secure the optical path of the pump light and the probe light.

The tri-axial Helmholtz coil 422 is placed inside a magnetic shield, not illustrated, around the isothermal heat-insulation bath 421. This magnetic shield reduces magnetic fields penetrating from an external environment. The tri-axial Helmholtz coil 422 is used to control the magnetic field environment around the cell 401. During DC operation, the tri-axial Helmholtz coil 422 is used to make the magnetic field zero around the cell 401, while during AC operation, it is used to generate a bias magnetic field so that the measurement frequency agrees and resonates with the Larmor frequency. The bias magnetic field is applied in the same direction as the pump light (x direction in FIG. 4). A shim coil may further be added to correct the unevenness of the magnetic field.

The wavelength of the pump light 407 emitted from the pump light source 402 is tuned in resonance with D1 transitions of the Rb atoms. As the wavelength of the pump light 407, although a wavelength of 780.2 nm in resonance with D2 transitions of the Rb atoms can also be used, a wavelength of 795.0 nm in resonance with D1 transitions is preferred because it increases the spin polarization. The polarization of this pump light is converted to circular polarization by the quarter-wave plate 412 after being formed into a linearly polarized state by the linear polarizer 411a. In this case, the polarization may be converted to either clockwise circular polarization or counterclockwise circular polarization.

The wavelength of the probe light 408 emitted from the probe light source 403 is detuned about several GHz from the resonance with D1 transitions of the K atoms so that signal response will be maximized. The detuning value for maximizing the signal response depends on the pressure and temperature of the buffer gas in the cell 401. The polarization of the probe light becomes linear polarization by means of the linear polarizer 411b.

The dichroic mirror 404 is placed on the optical path of the pump light 407 and the probe light 408 to overlap the two light so that the light will enter the cell 401 from the same direction. Here, a dichroic mirror designed to reflect light with the wavelength of the pump light 407 and transmit light with the wavelength of the probe light 408 is used as the dichroic mirror 404. If the pump light and the probe light can be overlapped and illuminated onto the cell, the dichroic mirror can be replaced by a half mirror. However, the dichroic mirror is preferred because it does not halve the optical intensities of respective light when the pump light and the probe light are overlapped.

A dichroic mirror designed to reflect light with the wavelength of the pump light 407 and transmit light with the wavelength of the probe light 408 is also used as the dichroic mirror 405 on the cell exit side. The dichroic mirror 405 is at least required to split light into the pump light and the probe light and guide only the probe light to the polarization measurement system 406. The reflected pump light 407 is absorbed by the optical terminator 409. Otherwise, the pump light 407 may be reflected 180 degrees by the dichroic mirror 405 to enter the cell again so that the spin polarization can be increased. When the intensity of the pump light 407 is high, an isolator or the like may be used in this layout so that the pump light 407 will not return to the pump light source 402. Otherwise, a sharp cut filter allowing only light in a specific wavelength range to transmit can also be used. In this case, since the termination of the pump light does not need to be processed, it can be placed at any angle as long as the wavelength characteristics of absorption and transmission are retained.

The polarization measurement system 406 measures polarization in the probe light 408, and reads a measured magnetic field from the rotation angle. As such a polarization measurement system, the balance-type measurement system in FIG. 3 can be employed. Otherwise, a combination of a polarization measurement system and dichroic mirrors illustrated in FIG. 5 can be employed.

Figure 5:
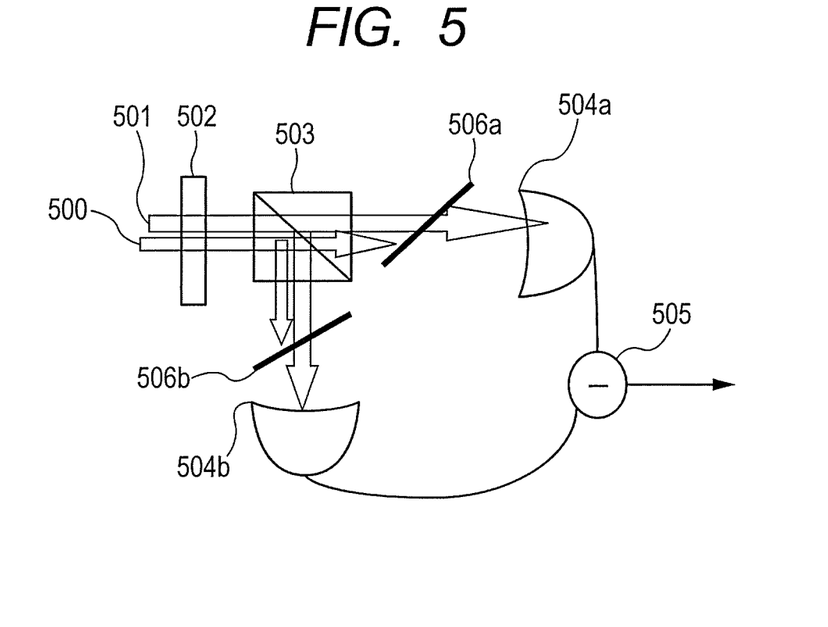
FIG. 5 is a conceptual diagram of an exemplary structure in which dichroic mirrors are arranged in the polarization measurement system in Example 1 of the present invention.

FIG. 5 is a conceptual diagram of an exemplary structure in which the dichroic mirrors (wavelength discrimination unit) are arranged in the polarization measurement system (detection unit). In this exemplary structure, the dichroic mirrors are arranged in the polarization measurement system configured to include a polarizing beam splitter (polarizer) and photodiodes (light-receiving elements). Then, the structure is so configured that the pump light and the probe light that passed through the polarizer are transmitted through the dichroic mirrors, respectively.

Specifically, this structure has two dichroic mirrors 506a and 506b in addition to a half-wave plate 502, a polarizing beam splitter 503, two photodiodes 504a and 504b, and a differential circuit 505. The dichroic mirrors exist immediately behind the polarizing beam splitter to reflect a pump light 500 and transmit a probe light 501.

In this exemplary structure, since the dichroic mirrors are placed behind the polarizing beam splitter 503, the influence of the dichroic mirrors on the polarization plane of the probe light 501 does not need to care about.

Example 2

Figure 6:
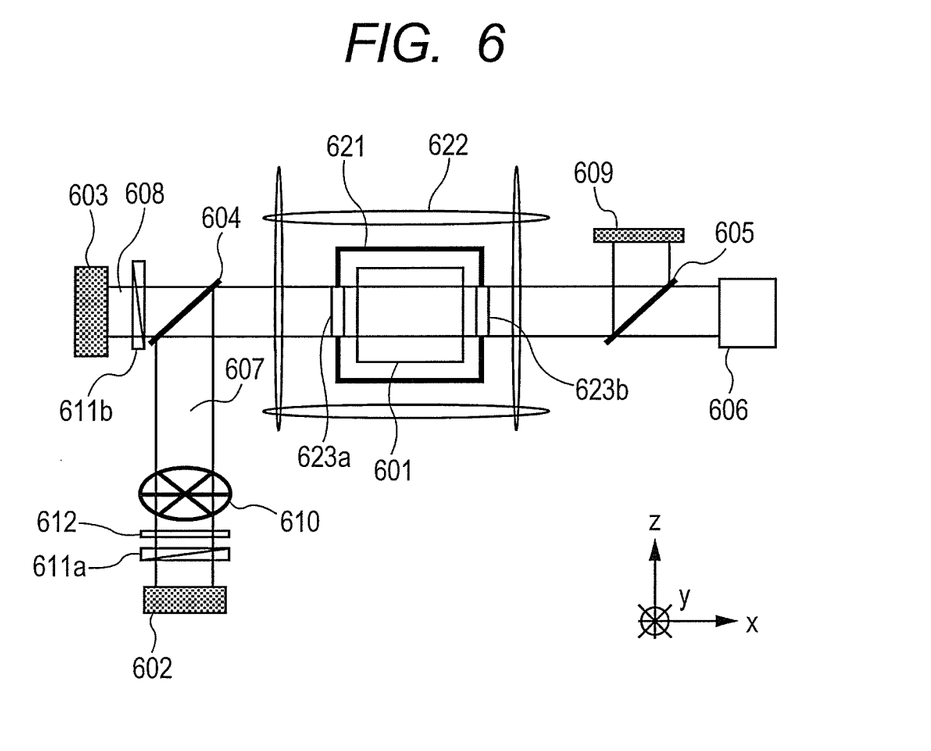
FIG. 6 is a schematic sectional view of an optically pumped magnetometer in Example 2 of the present invention.

An exemplary structure of AC magnetic field measurement by a single-axis optically pumped magnetometer different in form from that of Example 1 will be described as Example 2 with reference to FIG. 6. As illustrated in FIG. 6, an alkali-metal hybrid optically pumped magnetometer of the example includes a cell 601 containing two different kinds of alkali-metal atom groups, namely rubidium (Rb) and potassium (K), a pump light source 602, and a probe light source 603. The optically pumped magnetometer also includes dichroic mirrors 604 and 605, a polarization measuring system 606, a terminator 609, an optical chopper 610, linear polarizers 611a and 611b, a quarter-wave plate 612, an isothermal heat-insulation bath 621, a tri-axial Helmholtz coil 622, and optical windows 623a and 623b.

In the following description of the example, description of portions overlapping those in Example 1 is omitted, and only different portions are described. The optical chopper 610 performs on/off actions for alternately repeating an on-state and an off-state so that a pump light 607 will be synchronized with the frequency of a measured oscillating magnetic field. Here, the on state is a state in which the pump light 607 is incident on the cell 601, and the off state is a state in which the pump light is shielded not to enter the cell 601 or the light intensity of the pump light is greatly reduced. The chopper 610 may have a blade rotate to block or allow passage of light. The chopper 610 is placed in a position before the pump light 607 and a probe light 608 are overlapped such that only the pump light 607 is chopped. Instead of the chopper 610, a drive current of the pump light source 602 can be modulated to change the intensity.

Otherwise, a frequency modulation can be applied to the pump light 607 to detune it from D1 line resonance in order to stop optical pumping, or an EO modulator or the like can be used to perform retardation modulation to change from a circularly polarized state to a linearly polarized state in order to stop optical pumping.

The cell 601 contains two kinds of alkali-metal atom groups with equal nuclear spin as a first alkali-metal atom group and a second alkali-metal atom group. In the example, $^{87}$Rb and $^{33}$K are enclosed as the alkali-metal atom groups. The two kinds of atoms agree in that the nuclear spin I is 3/2, having an equal gyromagnetic ratio of 7 GHz/T. When the nuclear spins of the two kinds of atoms are not equal, the gyromagnetic ratios are different, so that the two kinds of atomic spins rotate with different periods under a static magnetic field. When two kinds of atoms that exchange their spins consistently rotate with different periods, the spin exchange leads to the relaxation of the rotation phases, enhancing T: relaxation.

When the magnetometer reads a magnetic field using a component periodically oscillating in the static magnetic field among spin polarization vectors, the shorter the $T_2$ relaxation time is, the lower the response to the measured magnetic field will be, which means that the output signal obtained is small.

To avoid this problem, it is preferred in this example that the nuclear spins of the two kinds of atoms be equal to each other.

Like in Example 1, the tri-axial Helmholtz coil 622 is used to control the magnetic field environment around the cell 601, but the bias magnetic field applying direction is different. The tri-axial. Helmholtz coil 622 applies the bias magnetic field in a direction (y direction or z direction in FIG. 6) perpendicular to the pump light.

Figure 7A:
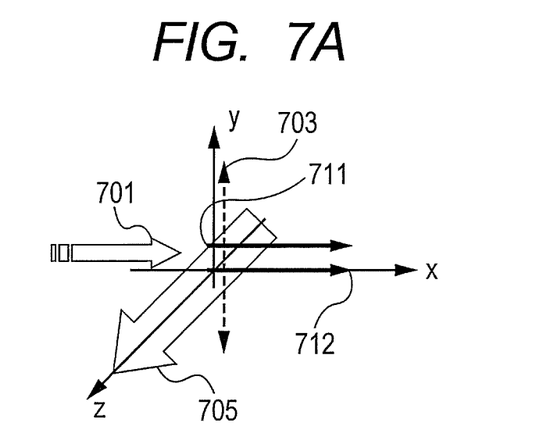
FIGS. 7A and 7B are conceptual diagrams illustrating the behavior of atomic spins in Example 2 of the present invention.
Figure 7B:
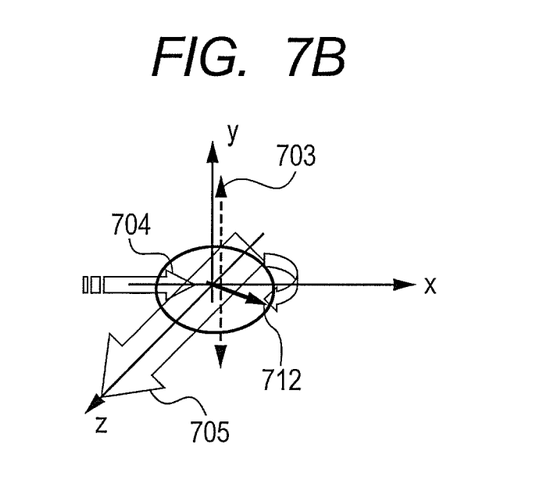

FIG. 7A and FIG. 7B are conceptual diagrams illustrating the behavior of atomic spins in the example.

A pump light 701 is repeatedly turned on and off by a chopper with the same frequency as the frequency of a measured oscillating magnetic field 703. A bias magnetic field 705 is applied in a direction (z direction in FIG. 7A and FIG. 7B) perpendicular to the pump light 701. When the pump light 701 is incident on the cell, an Rb spin 711 and a K spin 712 are polarized in the x direction as illustrated in FIG. 7A. When the pump light is in the off state, the K atomic spin 712 rotates in the x-y plane as illustrated in FIG. 7B. In this case, the magnitude of the bias magnetic field 705 is so selected that the Larmor frequency of the rotational motion will agree with the frequency of the measurement target oscillating magnetic field 703.

The K spin 712 rotating in the x-y plane resonates with the measured magnetic field oscillating with the same frequency, and the spin is subjected to a torque to form a component in the z direction. Thus, the magnitude of the x-y plane component of the spin rotating in the x-y plane becomes small. Since this amount of change is determined according to the amplitude of the measured magnetic field, it is read by the probe light 704. This has the advantage of making it easier to apply a modulation.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-094655, filed Apr. 18, 2012, which is hereby incorporated by reference herein in its entirety.

What is claimed is:

1. An optically pumped magnetometer using atomic electron spin or nuclear spin, comprising:
   a cell containing at least a first alkali-metal atom group and a second alkali-metal atom group interacting via spin exchange with the first alkali-metal atom group, wherein a nuclear spin of the first alkali-metal atom group and a nuclear spin of the second alkali-metal group are the same, and wherein an element constituting the first alkali-metal atom group is different from an element constituting the second alkali-metal atom group,
   a pump light system that causes a pump light to enter the cell, where the pump light has a first wavelength in order to spin-polarize the first alkali-metal atom group;
   a probe optical system that causes probe light entering the cell to form an optical axis identical to the pump light, where the probe light has a second wavelength different from the first wavelength, and where the probe light measures spin polarization of the second alkali-metal atom group;

wherein the pump light and the probe light are overlapped and illuminated onto the cell;
a measuring unit configured for measuring a rotation angle of a polarization plane of the probe light that is passed through the cell; and
a wavelength discrimination unit that transmits the probe light from the cell into the measuring unit without transmitting the pump light from the cell into the measuring unit.

2. The optically pumped magnetometer according to claim 1, further comprising:
a chopping unit configured for switching between a state in which the pump light enters the cell and a state in which the pump light does not enter the cell so that the pump light becomes synchronous with a measured magnetic field, and
wherein a bias magnetic field is applied with a tri-axial Helmholtz coil in a direction perpendicular to the pump light in order to enable measurement of an oscillating magnetic field.

3. The optically pumped magnetometer according to claim 1,
wherein the pump light and the probe light that are transmitted through the wavelength discrimination unit both enter the measuring unit.

4. The optically pumped magnetometer according to claim 3,
wherein the wavelength discrimination unit is arranged inside the measuring unit and includes a polarizer and a light-receiving element, and
wherein the pump light and the probe light that has passed through the polarizer is transmitted through the wavelength discrimination unit.

5. The optically pumped magnetometer according to claim 1, wherein
the first alkali-metal atom group consists of rubidium atoms,
the second alkali-metal atom group consists of potassium atoms,
the pump light has a wavelength of 795.0 nm as the first wavelength, and
the probe light has a wavelength that is not less than 769 nm and not more than 771 nm as the second wavelength.

6. The optically pumped magnetometer according to claim 1, wherein
the first alkali-metal atom group consists of cesium atoms,
the second alkali-metal atom group consists of potassium atoms,
the pump light has a wavelength of 894.6 nm as the first wavelength, and the probe light has a wavelength that is not less than 769 nm and not more than 771 nm as the second wavelength.

7. The optically pumped magnetometer according to claim 1, wherein
the first alkali-metal atom group consists of potassium atoms,
the second alkali-metal atom group consists of rubidium atoms,
the pump light has a wavelength of 770.1 nm as the first wavelength, and the probe light has a wavelength that is not less than 794 nm and not more than 796 nm.

8. The optically pumped magnetometer according to claim 1, wherein
the first alkali-metal atom group consists of potassium atoms,
the second alkali-metal atom group consists of cesium atoms,
the pump light has a wavelength of 770.1 nm as the first wavelength, and
the probe light has a wavelength that is not less than 893 nm and not more than 896 nm.

9. The optically pumped magnetometer according to claim 1, wherein
the first alkali-metal atom group consists of cesium atoms,
the second alkali-metal atom group consists of rubidium atoms,
the pump light has a wavelength of 894.6 nm as the first wavelength, and
the probe light has a wavelength that is not less than 794 nm and not more than 796 nm.

10. The optically pumped magnetometer according to claim 1, wherein
the first alkali-metal atom group consists of consists of rubidium atoms,
the second alkali-metal atom group consists of cesium atoms,
the pump light has a wavelength of 795.0 nm as the first wavelength, and
the probe light has a wavelength that is not less than 893 nm and not more than 896 nm.

* * * * *